United States Patent
Matsuki

(10) Patent No.: US 8,299,536 B2
(45) Date of Patent: Oct. 30, 2012

(54) SEMICONDUCTOR DEVICE HAVING TRANSISTORS EACH HAVING GATE ELECTRODE OF DIFFERENT METAL RATIO AND PRODUCTION PROCESS THEREOF

(75) Inventor: Takeo Matsuki, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 70 days.

(21) Appl. No.: 12/923,747

(22) Filed: Oct. 6, 2010

(65) Prior Publication Data
US 2011/0031553 A1 Feb. 10, 2011

Related U.S. Application Data

(62) Division of application No. 12/068,713, filed on Feb. 11, 2008, now Pat. No. 7,816,213.

(30) Foreign Application Priority Data

Mar. 1, 2007 (JP) .................................. 2007-051060

(51) Int. Cl.
*H01L 21/00* (2006.01)
(52) U.S. Cl. .......................... 257/368; 257/369; 257/288
(58) Field of Classification Search .......... 257/368–369, 257/288
See application file for complete search history.

(56) References Cited

U.S. PATENT DOCUMENTS

| | | | | |
|---|---|---|---|---|
| 4,907,053 A | * | 3/1990 | Ohmi | 257/315 |
| 5,256,591 A | * | 10/1993 | Jun | 438/424 |
| 5,576,579 A | * | 11/1996 | Agnello et al. | 257/751 |
| 5,776,823 A | * | 7/1998 | Agnello et al. | 438/592 |
| 5,796,166 A | * | 8/1998 | Agnello et al. | 257/751 |
| 5,913,139 A | * | 6/1999 | Hashimoto et al. | 438/618 |
| 6,121,083 A | * | 9/2000 | Matsuki | 438/254 |
| 6,157,068 A | * | 12/2000 | Hashimoto et al. | 257/384 |
| 6,274,488 B1 | * | 8/2001 | Talwar et al. | 438/655 |
| 6,337,272 B1 | * | 1/2002 | Hamanaka | 438/651 |
| 6,376,888 B1 | * | 4/2002 | Tsunashima et al. | 257/407 |
| 6,380,057 B1 | * | 4/2002 | Buynoski et al. | 438/592 |
| 6,406,743 B1 | | 6/2002 | Lee et al. | |
| 6,407,422 B1 | * | 6/2002 | Asano et al. | 257/306 |
| 6,420,264 B1 | * | 7/2002 | Talwar et al. | 438/682 |

(Continued)

FOREIGN PATENT DOCUMENTS

JP 2000-243853 9/2000

(Continued)

OTHER PUBLICATIONS

"Scalability of Ni FUSI gate processes; phase and Vt control to 30 nm gate length," Kittl, et al., 2005, Symposium on VLSI Technology Digest of Technical papers, p. 72-73.

(Continued)

*Primary Examiner* — Laura Menz
(74) *Attorney, Agent, or Firm* — McGinn IP Law Group, PLLC

(57) ABSTRACT

A semiconductor device with integrated MIS field-effect transistors includes a first transistor including a first gate electrode having a composition represented by MAx, and a second transistor including a second gate electrode having a composition represented by MAy, in which M includes at least one metal element selected from the group consisting of W, Mo, Ni, Pt, Ta, Pd, Co, and Ti, A includes at least one of silicon and germanium, and $0<x\leq3$, and $0<y\leq3$, and x and y are different from each other.

4 Claims, 9 Drawing Sheets

U.S. PATENT DOCUMENTS

| | | | | |
|---|---|---|---|---|
| 6,423,999 | B1* | 7/2002 | Matsuki | 257/306 |
| 6,429,089 | B1* | 8/2002 | Matsuki | 438/396 |
| 6,432,805 | B1* | 8/2002 | Paton et al. | 438/592 |
| 6,531,749 | B1* | 3/2003 | Matsuki et al. | 257/388 |
| 6,544,890 | B2* | 4/2003 | Hamanaka | 438/682 |
| 6,605,513 | B2* | 8/2003 | Paton et al. | 438/299 |
| 6,645,798 | B2* | 11/2003 | Hu | 438/197 |
| 6,723,658 | B2* | 4/2004 | Eissa et al. | 438/745 |
| 6,737,724 | B2* | 5/2004 | Hieda et al. | 257/519 |
| 6,831,343 | B2* | 12/2004 | Hu | 257/454 |
| 6,835,639 | B2* | 12/2004 | Rotondaro et al. | 438/592 |
| 6,933,565 | B2* | 8/2005 | Matsumoto et al. | 257/347 |
| 6,936,528 | B2* | 8/2005 | Koo et al. | 438/583 |
| 6,982,474 | B2 | 1/2006 | Currie et al. | |
| 7,217,603 | B2 | 5/2007 | Currie et al. | |
| 7,419,905 | B2* | 9/2008 | Mangelinck et al. | 438/664 |
| 7,495,298 | B2 | 2/2009 | Hayashi et al. | |
| 7,564,061 | B2* | 7/2009 | Mimura | 257/76 |
| 7,592,674 | B2 | 9/2009 | Takahashi et al. | |
| 7,605,045 | B2 | 10/2009 | Peidous et al. | |
| 7,642,153 | B2 | 1/2010 | Pas | |
| 7,645,692 | B2 | 1/2010 | Matsubara et al. | |
| 7,816,213 | B2* | 10/2010 | Matsuki | 438/283 |
| 7,884,428 | B2* | 2/2011 | Yoshida et al. | 257/412 |
| 8,110,457 | B2* | 2/2012 | Futase | 438/197 |
| 2003/0122179 | A1* | 7/2003 | Matsuki et al. | 257/314 |
| 2003/0234439 | A1 | 12/2003 | Currie et al. | |
| 2005/0042849 | A1 | 2/2005 | Currie et al. | |
| 2005/0156210 | A1 | 7/2005 | Currie et al. | |
| 2006/0071282 | A1* | 4/2006 | Kadoshima et al. | 257/369 |
| 2006/0081947 | A1* | 4/2006 | Mimura | 257/407 |
| 2006/0214198 | A1* | 9/2006 | Matsuki et al. | 257/288 |
| 2006/0234058 | A1* | 10/2006 | Ohmi et al. | 428/409 |
| 2006/0263961 | A1 | 11/2006 | Kittl et al. | |
| 2008/0029822 | A1 | 2/2008 | Tsuchiya et al. | |
| 2008/0105910 | A1* | 5/2008 | Matsuki | 257/295 |
| 2008/0211000 | A1* | 9/2008 | Matsuki | 257/296 |
| 2008/0246102 | A1* | 10/2008 | Yoshida et al. | 257/412 |
| 2009/0011566 | A1 | 1/2009 | Okada et al. | |
| 2009/0045469 | A1 | 2/2009 | Takahashi | |
| 2009/0057787 | A1* | 3/2009 | Matsuki et al. | 257/411 |
| 2009/0115002 | A1* | 5/2009 | Tatsumi et al. | 257/412 |
| 2010/0078731 | A1 | 4/2010 | Tsuchiya et al. | |
| 2010/0093139 | A1* | 4/2010 | Futase | 438/197 |
| 2011/0031553 | A1* | 2/2011 | Matsuki | 257/368 |
| 2011/0175172 | A1* | 7/2011 | Matsuki | 257/369 |

FOREIGN PATENT DOCUMENTS

| | | |
|---|---|---|
| JP | 2000-252462 | 9/2000 |
| JP | 2005-217275 | 8/2005 |
| JP | 2005-228868 | 8/2005 |
| JP | 2006-41339 (A) | 2/2006 |
| JP | 2006-278369 (A) | 10/2006 |
| JP | 2006-324627 (A) | 11/2006 |
| WO | 2006/001271 (A1) | 1/2006 |
| WO | WO 2006/137371 (A1) | 12/2006 |

OTHER PUBLICATIONS

"Material Characterization of Metal-Germanide Gate Electrodes Formed by FUGE (Fully Germanided) Process,"Tsuchiya, et al., Extended Abstract of the 2005 International Conference of Solid State Devices and Materials, Kobe, 2005, p. 844-845.

"Demonstration of Fully Ni-Silicided Metal Gates on Hf02 based high-k gate dielectrics as a candidate for low power applications," Anil, et al., 2004 Symposium on VLSI Technology Digest of Technical papers, p. 190-191.

"CMOS Integration of Dual Work Function Phase Controlled Ni FUSI with Simultaneous Silicidation of NMOS (NiSi) and PMOS (Ni-rich Silicide) Gates on HfSION," Lawyers, et al., Technical Digest of 2005 International Electron Device Meeting, p. 661-664.

Notification of Reason(s) for Refusal dated Jul. 10, 2012, with English translation.

* cited by examiner

101

SEMICONDUCTOR DEVICE HAVING TRANSISTORS EACH HAVING GATE ELECTRODE OF DIFFERENT METAL RATIO AND PRODUCTION PROCESS THEREOF

The present application is a Divisional Application of U.S. patent application Ser. No. 12/068,713, filed on Feb. 11, 2008 now U.S. Pat. No. 7,816,213, based on Japanese patent application No. 2007-051060 filed on Mar. 1, 2007, the entire contents of which are incorporated herein by reference.

BACKGROUND OF THE INVENTION

1. Field of the Invention

The present invention relates to a semiconductor device provided with a plurality of field-effect transistors on a semiconductor substrate and a production process thereof.

2. Description of Related Art

A metal oxide semiconductor field-effect transistor (MOSFET) or a metal insulator semiconductor field-effect transistor (MISFET), which has a semiconductor substrate of silicon and a polycrystalline silicon gate, has been developed to have higher performance by various techniques for microfabrication, film-making and impurity controlling. For example, combining MISFETs of different threshold voltage characteristics realizes integrated circuit devices exhibiting various functions.

It is known, however, that carriers are depleted in a gate electrode of polycrystalline silicon, when an MOSFET channel is turned around to deteriorate its performance. Some approaches proposed to avoid the above problem are use of a gate electrode of a metal, metal silicide as a compound of metal and silicon, and metal germanide as a compound of metal and germanium (Patent Document 1, and Non-Patent Documents 1 and 2). FIG. 5 illustrates an MOSFET with a gate electrode of metal silicide 506, as Conventional Example 1, described in Patent Document 1. It has a source-drain region disposed on semiconductor substrate 501 via a channel region. The source-drain region has a structure with lightly doped drains (LDD) or source-drain extensions 502, and a low impurity concentration diffusion region near the channel region. It also has metal silicide films 504 on a high impurity concentration region 503 surface adjacent to the low impurity concentration diffusion region. Semiconductor substrate 501 is an N-type or P-type silicon substrate, or a P-type or N-type well region formed on an N-type or P-type substrate. The gate electrode is formed on gate-insulating film 505. This gate electrode is composed only of metal silicide 506. Each of side spacers 507 for the gate electrode has a structure necessary for forming the source-drain region, and is formed of a silicon oxide or silicon nitride film. The MOSFET as the conventional device (Conventional Example 1) has the gate electrode composed only of metal silicide, and can solve the above-described problem of depletion of the gate electrode. The gate-insulating film may be of silicon oxide or silicon oxynitride, which contains nitrogen. Conventional Example 1 uses cobalt silicide ($CoSi_2$) or NiSi as the metal silicide.

FIG. 6 illustrates a MISFET as Conventional Example 1 production process. First, an isolation film is formed on P- or N-type silicon substrate 601 (FIG. 6A). The isolation film can be formed by shallow trench isolation, for example. A well impurity is injected into an active device by ion implantation. Then, a gate-insulating film and polycrystalline silicon are deposited to 1 to 5 nm and about 50 nm, respectively. Then, the polycrystalline silicon is treated by lithography and anisotropic etching to selectively leave a portion, which later becomes a gate electrode. The gate electrode of polycrystalline silicon is referred to as sacrificial gate 602 (FIG. 6B).

Next, side walls of silicon oxide film 603 are formed by an oxidation step, and source-drain extensions 604 (low impurity concentration regions) are formed by ion implantation (FIG. 6C). They are treated by activation RTA (rapid thermal annealing) carried out at about 800° C., and then by CVD and anisotropic etching to form silicon nitride film spacers 605. Then, high impurity concentration regions 606 in the source-drain regions are formed by ion implantation and activation RTA. High impurity concentration region 606 has a deeper junction than the extension, described above (FIG. 6D).

Then, the polycrystalline silicon film and high impurity concentration regions 606 are coated with a two-layer laminate composed of Co and TiN formed by sputtering in this order, after they are treated to remove the silicon oxide and insulating films from their surfaces. Thickness of the Co film is set at a level necessary for totally converting the polycrystalline silicon into the silicide. In Conventional Example 1, the thickness is set at 16 nm. The TiN film functions as an oxidation inhibiting film (FIG. 6E). The polycrystalline silicon is converted by RTA into $CoSi_2$, which covers high impurity concentration regions 606 in the source-drain regions. Then, the unreacted Co and TiN are removed by selective etching (FIG. 6F).

The subsequent steps (not shown) follow a common procedure for producing an MISFET, involving, for example, deposition of an insulating film to totally cover the above structure, CMP treatment for flattening the film, opening the contact in each of the source, drain and gate regions, and filling the openings with a plug containing tungsten (W) or the like, to produce an MISFET.

This production process gives the gate electrode composed only of the $CoSi_2$ film on the gate-insulating film and, at the same time, a self-aligning silicide electrode structure having a $CoSi_2$ film also in the source-drain regions. It has an advantage for giving a metallic gate electrode by the exactly same number of steps as in a conventional silicide production process.

The production process of Conventional Example 1, however, needs a deeper junction in the high impurity concentration region in the source-drain region than the thickness of $CoSi_2$. It is however necessary to reduce the junction depth of the high impurity concentration region to produce a finer device, and hence to reduce the thickness of the $CoSi_2$ film and also thickness of the polycrystalline silicon film. This causes a problem of reduced margin of the process including the fabrication step.

One of the processes proposed to solve the above problem is the one described in Non-patent Document 3, the process being referred to as Conventional Example 2, which is described by referring to FIG. 7.

Conventional Example 2 adopts a procedure similar to that of Conventional Example 1 for forming a polycrystalline silicon film (FIG. 7A), where gate-insulating film 702 and polycrystalline silicon film 703 are formed on silicon substrate 701 in this order. Then, a hard mask film of silicon oxide is formed and treated by lithography to form hard mask 704. The polycrystalline silicon is treated by anisotropic etching with hard mask 704 to form sacrificial gate of polycrystalline silicon 705 (FIG. 7B).

Then, drain-source extension 706 (low impurity concentration region), side walls of silicon oxide 707 and spacers 708 of silicon nitride film are formed in a manner similar to that for Conventional Example 1. It is noted that this step should be carried out to leave hard mask 704 on the polycrystalline silicon, when spacers of silicon nitride film 708 are formed by anisotropic etching (FIG. 7C).

Next, high impurity concentration region 709 is formed by ion implantation in the source-drain region, and coated selectively with a metal silicide film by a conventional technique. One example of metal silicides useful here is NiSi. The metal silicide film can be obtained by RTA treatment of Ti and TiN films formed in this order at around 450° C. to remove TiN and surplus Ni. This step forms the metal silicide film on the source-drain region but not on sacrificial gate 705, which is covered by hard mask 704 (FIG. 7D).

A silicon oxide film is deposited as interlayer insulation film 710 thicker than depth of the surface steps evolving as a result of formation of the laminate structure of the polycrystalline silicon and hard mask 704, treated to have the flattened surface by CMP, and etched backed to expose the upper side of the polycrystalline silicon (FIG. 7E). A Ni film is formed, and the polycrystalline silicon is totally converted into NiSi (FIG. 7F).

The above process can independently control thickness of the silicide in the source-drain region and that of silicide in the gate electrode.

The conventional examples to convert the gate electrode into $CoSi_2$ or NiSi are described above. The gate electrode and the source-drain region can be composed of a germanide by replacing the silicon substrate with a germanium substrate and forming a germanium film on the gate-insulating film, as proposed by Non-Patent Document 2. Moreover, it is considered that a gate electrode of germanide can be easily formed on a silicon substrate based on the process concept described in Non-patent Document 2 in consideration of that described in Non-patent Document 3. Still more, platinum silicide is also effective as a silicide, according to Patent Document 4.

Non-patent Document 1 points out that, when MISFETs containing a nickel monosilicide (NiSi) gate electrode having a width or length different from that of the another electrode are integrated on a semiconductor substrate, the production processes described in Patent Document 1 and Non-patent Document 3 involve problems occurring while a sacrificial gate of inadequate length is treated to form a silicide to give a defective sacrificial gate. More specifically, sacrificial gate 801 of insufficient length may have Ni-excessive silicide 803, while sacrificial gate 802 of excessive length may turn into unreacted sacrificial gate 804 containing an insufficient amount of silicide because the silicide cannot be formed to an interface with a gate-insulating film (FIGS. 8A and 8B). Non-patent Document 1 discusses that RTA-treatment of polycrystalline silicon can completely convert it into a silicide to solve the above problems.

FIG. 9 illustrates a conventional production process (Conventional Example 3) described in Non-patent Document 1. First, the production process described by Non-patent Document 3 is used to selectively leave polycrystalline silicon to be converted into silicide, form shorter sacrificial gate 901 and longer sacrificial gate 902, and expose their upper sides (FIG. 9A).

Next, a Ni film is deposited, and reacted with polycrystalline silicon by RTA to have a laminated structure of $Si/Ni_2Si$, where polycrystalline silicon film 903 is left to prevent the $Si/Ni_2Si$ structure from coming into contact with a gate-insulating film (FIG. 5 in Non-patent Document 5, or FIG. 9B in this specification). Thickness of the $Ni_2Si$ film is set in accordance with quantity of Ni deposited, impurity species present in the polycrystalline silicon, and RTA treatment temperature and time. In particular, the effects of RTA temperature are described in Non-patent Document 1, FIGS. 6 and 7. RTA temperature is preferably 300° C. or lower, which is lower than about 400° C. known as a temperature at which NiSi is formed. The unreacted metal is selectively removed by etching. Then, RTA treatment is again used to diffuse Ni from the $Ni_2Si$ layer to the lower Si layer. This converts the metallic gate layer which comes into contact with the gate-insulating film into that of NiSi (FIG. 9C).

This process solves problems of variation of MISFET characteristics resulting from the gates of different lengths. Non-patent Document 1 discusses that $Ni_3Si$ can be formed by setting a thickness of the Ni film to be reacted with polycrystalline silicon at 1.7 times of the polycrystalline silicon film thickness, and that $Ni_3Si$ has a 0.1 to 0.4 eV higher work function than NiSi. Hence, use of $Ni_3Si$ for the gate electrode can decrease a threshold voltage of the P-type MISFET.

Non-patent Document 4 discusses a process for forming a silicide gate electrode of Ni-rich composition on a wafer, where the composition contains Ni (including that in NiSi) in excess of Si. This gives the NiSi electrode having a work function of about 4.5 eV and the Ni-rich electrode having a higher work function. The process of Non-Patent Document 4 varies thickness of the polycrystalline silicon to be reacted with Ni between an nMOSFET and a pMOSFET, as does the process described in Non-patent Document 1. It uses a thinner polycrystalline silicon in a P-MOSFET than in an nMOSFET to form NiSi in the nMOSFET and Ni-rich silicide in the pMOSFET. This process, however, involves the reactions of Ni varying with transistor deposition density and Ni-silicon reaction time to vary the Ni/Si ratio. The resulting device can be no longer expected to work properly because of variation of transistor threshold voltage.

There are other attempts made to control the threshold value. Patent Document 2 described a two-layered gate electrode film, with the lower film of silicon doped with an electroconducting material and the upper electroconductive film of metal silicide, wherein thickness of the lower film is varied to control the threshold value. The process, however, involves problems related to gate electrode fabricability. The lower electroconductive film has a varying thickness between n- and p-channel regions although the upper electroconductive film has a constant thickness, with the result that the gate-insulating film or substrate for the thinner electroconductive film will be exposed during an etching step and excessively etched. Moreover, the lower electroconductive film is fabricated in such a way to have the thickness varying between an n- and p-channel transistors, and a silicon oxide film may be partly formed in a layer which is to serve as a gate electrode, making it difficult to carry out etching for gate electrode formation.

Patent Document 3 describes a process for forming gate electrodes composed of a fully silicided and partly silicided portions to control the threshold value by utilizing their different characteristics. However, it still involves problems of gate depletion in the partly silicided gate.

[Patent Document 1] Japanese Patent Laid-Open No. 2000-252462

[Patent Document 2] Japanese Patent Laid-Open No. 2000-243853

[Patent Document 3] Japanese Patent Laid-Open No. 2005-228868

[Patent Document 4] Japanese Patent Laid-Open No. 2005-217275

[Non-Patent Document 1] "Scalability of Ni FUSI gate processes: phase and Vt control to 30 nm gate length," 2005 Symposium on VLSI Technology Digest of Technical papers, p. 72-73

[Non-Patent Document 2] "Material Characterization of Metal-Germanide Gate Electrodes Formed by FUGE (Fully Germanided) Process," Extended Abstract of the 2005 International Conference on Solid State Devices and Materials, Kobe, 2005, p. 844-845

[Non-Patent Document 3] "Demonstration of Fully Ni-Silicided Metal Gates on Hf02 based high-k gate dielectrics as a candidate for low power applications," 2004 Symposium on VLSI Technology Digest of Technical papers, p. 190-191

[Non-Patent Document 4] "CMOS Integration of Dual Work Function Phase Controlled Ni FUSI with Simultaneous Silicidation of NMOS (NiSi) and PMOS (Ni-rich Silicide) Gates on HfSiON," Technical Digest of 2005 International Electron Device Meeting, p. 661-664

It is necessary to set different threshold voltages of MISFETs constituting circuits for an LSI, which generally has integrated circuits of various functions. It is known that different threshold voltages can be realized by varying gate-insulating film thickness or channel impurity concentration in MISFETs. By combining with the process described in Non-patent Document 1, these processes can realize different threshold voltages.

However, a number of lithography steps and additional fabrication works are needed for realizing gate-insulating films of varying thicknesses. Moreover, it is difficult for the process described in Non-patent Document 1, which uses nitrided hafnium silicate (HfSiON) for a gate-insulating film, to form gate-insulating films of varying thicknesses on a single substrate.

A threshold voltage can be also controlled by varying impurity concentration in a substrate channel region. Increasing the concentration to increase the threshold voltage, however, may cause problems of deteriorated charge transfer in the channel by a scattered impurity. Decreasing the concentration to decrease the threshold voltage, on the other hand, may cause problems that an MISFET of short gate length can no longer work properly due to the short-channel effect.

Non-patent Document 4 discusses that a metal-rich silicide of monosilicide and metal, which contains the metal in excess of Si, can be produced. However, the reactions of Ni vary with transistor deposition density and Ni-silicon reaction time to vary the Ni/Si composition ratio, as discussed by Non-patent Document 1. The resulting device may be no longer expected to work properly because of variation of the Ni-rich silicide composition and hence variation of transistor threshold voltage.

The present invention has been developed under these situations. It is intended to set different threshold voltages for a semiconductor integrated circuit device which includes metal-insulator semiconductor field-effect transistors with a gate electrode of a metal semiconductor compound containing a metal, silicon and/or germanium as essential components without controlling impurity concentration in a gate-insulating film or channel region.

SUMMARY OF THE INVENTION

The inventors of the present invention have found, after having extensively studied to solve the above problems, that a semiconductor device having different threshold voltages can be realized with a plurality of gate electrodes composed of a metal semiconductor compound containing a metal, silicon and/or germanium as common essential components by varying their compositions while simplifying the overall steps, achieving the present invention.

A present invention provides a semiconductor device with integrated MIS field-effect transistors at least comprising a first transistor containing a first gate electrode having a composition represented by $MA_x$ and a second transistor containing a second gate electrode having a composition represented by $MA_y$, wherein M is at least one metal element selected from the group consisting of W, Mo, Ni, Pt, Ta, Pd, Co and Ti; A is silicon and/or germanium; $0<x\leq 3$ and $0<y\leq 3$, and x and y are different from each other.

The semiconductor device of the above structure can have different threshold voltages even in the well or channel region of the same impurity concentration without changing the thicknesses of gate-insulating films or having a plurality of channel regions of different impurity concentrations. The process can achieve good transistor performance by simple steps without needing a number of lithography steps or fabrication works.

A method of forming a semiconductor device, includes forming first and second gate electrodes, each including a metal material and a polycrystalline material, forming a film including the polycrystalline material on the second gate electrode without forming the film on the first gate electrode, and reacting the film with the second gate to reduce a compositional metal ratio in the second gate electrodes, thereby forming a first transistor having the first gate electrode and a second transistor having the second gate electrode, a threshold value of the first transistor being different from a threshold value of the second transistor.

The present invention can set different threshold voltages even on the same substrate impurity concentration region without controlling impurity concentration in a gate-insulating film or channel region, thus simplifying the overall production steps. It also can provide a semiconductor device having a plurality of threshold voltages without deteriorating the transistor performance.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

The semiconductor device of the present invention has integrated MIS field-effect transistors at least comprising a first transistor containing a first gate electrode having a composition represented by $MA_x$ and a second transistor containing a second gate electrode having a composition represented by MAy, wherein M is at least one metal element selected from the group consisting of W, Mo, Ni, Pt, Ta, Pd, Co and Ti; A is silicon and/or germanium; $0<x\leq3$ and $0<y\leq3$, and x and y are different from each other.

The semiconductor device has a structure with a plurality of transistors each containing a gate electrode, wherein these electrodes are composed of the same components in a different ratio to allow the device to have different threshold voltages.

The semiconductor device may include a third transistor containing a third gate electrode having a composition represented by MAz, wherein z is $0<z\leq3$, and z is different from x and y described above. A transistor including a gate electrode having a different composition may be included.

MAx, MAy and MAz representing the gate electrode compositions are each based on M for convenience, where M is not limited to unity. For example, $Ni_2Si$ for a gate electrode is included in the above compositions, and represented by $NiSi_{0.5}$ according to the above definition.

The MAx, MAy or MAz is formed by the reactions of at least the one metal element described above with silicon and/or germanium at 500° C. or lower.

The embodiments of the present invention are described in more detail by referring to the attached drawings, wherein the similar elements are marked with the same symbols and their description may be omitted to avoid unnecessary duplication.

Embodiment 1

Figure 1:
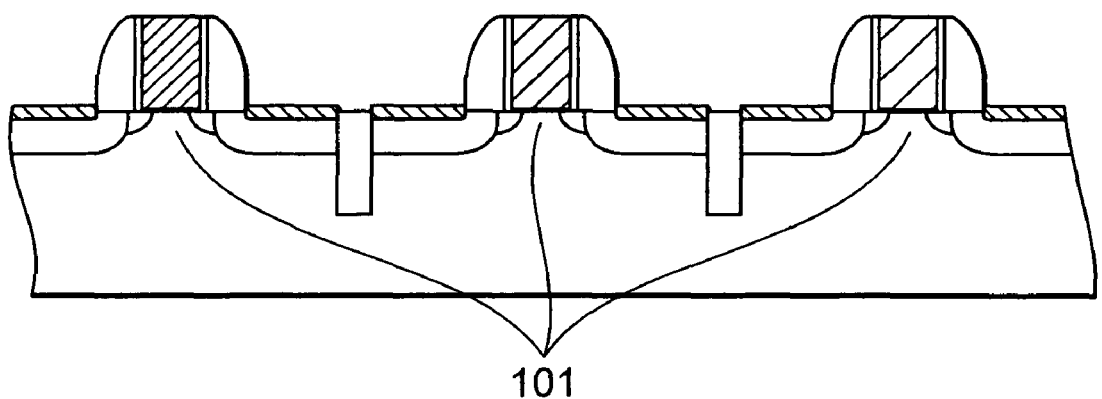
FIG. 1 is a cross-sectional view illustrating an MISFET of Embodiment 1.

FIG. 1 is a cross-sectional view illustrating an MISFET of Embodiment 1, showing three MISFETs disposed on a substrate, where they are isolated from one another by insulating isolation films. It has a common impurity concentration in a channel region and gate-insulating film. Gate electrodes are composed of a metal silicide, metal germanide or metal silicon germanide in a varying concentration, and are formed on the same substrate impurity concentration region 101. The metal silicide, for example, is NiSi, $Ni_2Si$ or $Ni_3Si$.

In Embodiment 1, the substrate can have the same impurity concentration in the channel region to suppress charge mobility deterioration resulting from scattering of high-concentration impurity in the channel region.

Embodiment 2

Embodiment 2 of the present invention is described by referring to FIGS. 2A-2E, using a cross-section of a single transistor as far as possible and cross-sections of a plurality of transistors as necessary.

Isolation films are formed on a semiconductor substrate by e.g., shallow trench isolation. An impurity is injected by ion implantation or the like into surfaces of a plurality of active device regions divided by the isolation films. Then, a gate-insulating film is formed on each of the active element regions.

Figure 2A:
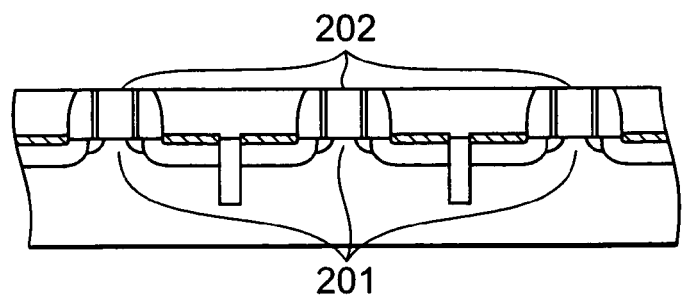
FIGS. 2A-2E show cross-sectional views illustrating production steps of Embodiment 2.

Then, a polycrystalline silicon film is formed on the same impurity concentration region 201 of the substrate via a gate-insulating film. The polycrystalline film is selectively etched to form a plurality of polycrystalline films 202 each having a gate electrode shape. Films 202 are treated by oxidation to form silicon oxide films as side walls for each of films 202. Source-drain regions are formed by ion implantation or the like with polycrystalline silicon film 202 therebetween. An electroconductive film of metal silicide is selectively formed on a surface of each source-drain region. An interlayer insulation film is formed to cover polycrystalline silicon film 202 and the electroconductive film. Then, the interlayer insulation film is selectively removed to expose the polycrystalline silicon film 202's upper side. Such a procedure forms a structure with polycrystalline silicon film 202 whose upper side alone is exposed from the interlayer insulation film of silicon oxide (FIG. 2A). The thickness of the silicided polycrystalline silicon film is preferably about 50 nm.

Figure 2B:
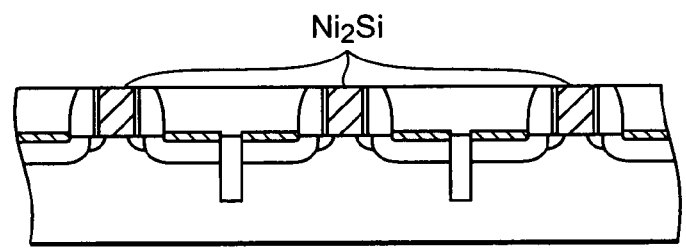

Next, a metal film is formed on the exposed polycrystalline silicon film 202's upper side to a thickness to eventually form a gate-insulating film of metal-excessive composition. For example, polycrystalline silicon film 202 is coated with an about 1.2 times thicker Ni film (for example to a thickness of about 80 nm). Then, polycrystalline silicon film 202 is reacted with the metal film under heating to form a gate electrode of metal silicide having a metal-excessive composition. For example, they are treated by RTA carried out at about 300° C. for about 150 seconds. This treatment completely converts polycrystalline silicon film 202 into silicide having a Ni-excessive composition (for example, $Ni_2Si$ in this case). Then, the unreacted metal is selectively removed by etching (FIG. 2B).

Figure 2C:
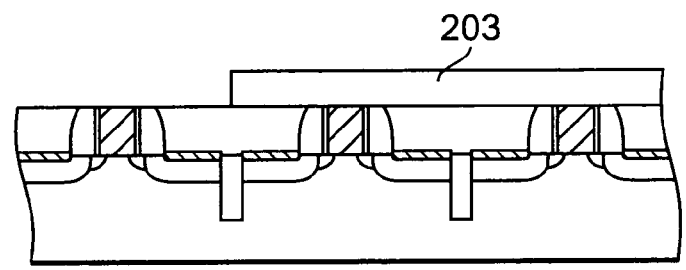

Next, silicon film 203 is deposited to totally cover the silicide film, and treated by lithography and etching to selectively leave silicon film 203 on the upper MISFET regions containing Ni in excess of Si, where reduction of work function is desired (FIG. 2C). The thickness of silicon film 203 is at least a film thickness defined by a formula (Ni film thickness required for forming $Ni_2Si$)/(Ni film thickness required for forming NiSi)—(polycrystalline silicon film thickness). More specifically, it is at least about 50 nm.

Figure 2D:
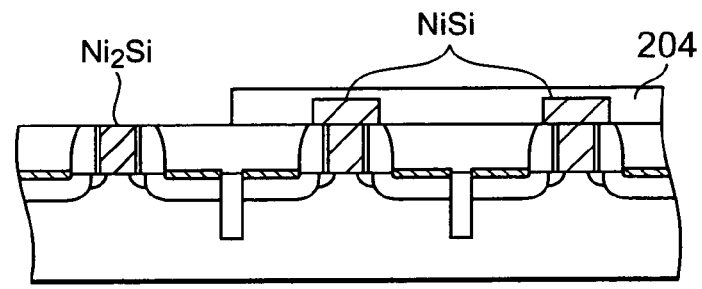

The gate electrode of metal silicide is reacted with selectively disposed silicon film 203 under heating to form a metal silicide having a reduced metal composition. For example, they are treated by RTA carried out at about 450° C. for about 60 seconds. This treatment diffuses Ni present in the silicide towards silicon film 203, to turn the gate electrode into that of NiSi. The RTA temperature is preferably in a range of 400 or more and 500° C. or less, more preferably 400 or more and 450° C. or less. NiSi formed on the source-drain region is not highly heat-resistant, and may cause increased diffusion layer resistance and leaked current in the layer, when exposed to an excessively high temperature. The gate electrode on the MISFET uncoated with the silicon film is left intact to keep $Ni_2Si$ (FIG. 2D).

Figure 2E:
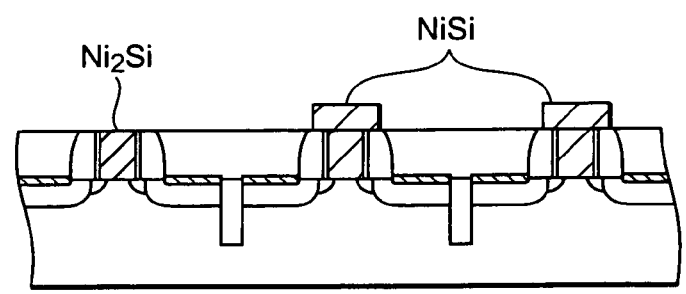

Unreacted silicon film 204 is selectively removed by etching (FIG. 2E). The selective etching is preferably carried out by dry etching with an HBr-containing gas or wet etching with an aqueous KOH solution.

The subsequent steps (not shown) follow a common procedure for producing an MISFET, involving, for example, deposition of an insulating film to totally cover the above structure, CMP treatment for flattening the film, opening the contact in each of the source, drain and gate regions, and filling the openings with a plug containing tungsten (W) or the like, to produce an MISFET.

As discussed above, the process of Embodiment 2 can form two types of silicide gate electrodes of NiSi, $Ni_2Si$ and the like on the same substrate. This embodiment carries out the heat treatment twice to form a gate electrode composed of two types of metal silicide.

Embodiment 3

As Embodiment 3, a process for forming three types of silicide gate electrodes of NiSi, $Ni_2Si$ and $Ni_3Si$, is described by referring to FIGS. 3A-3F.

Figure 3A:
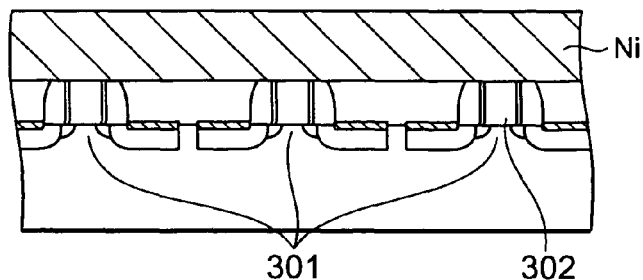
FIGS. 3A-3F show cross-sectional views illustrating production steps of Embodiment 3.

Embodiment 3 disposes polycrystalline silicon film 302, which is to be converted into silicides, on the same substrate impurity concentration region 301 via a gate-insulating film, and treats film 302 to have the upper side alone exposed from an interlayer insulation film of silicon oxide in the same manner as in Embodiment 2. Next, a Ni film is formed on the exposed polycrystalline silicon film 302's upper side to have a thickness of about 90 nm (FIG. 3A). For the thickness of the Ni film, Non-patent Document 1 discusses that it should be at least 1.7 times that of the polycrystalline silicon film (thickness: 50 nm).

Figure 3B:
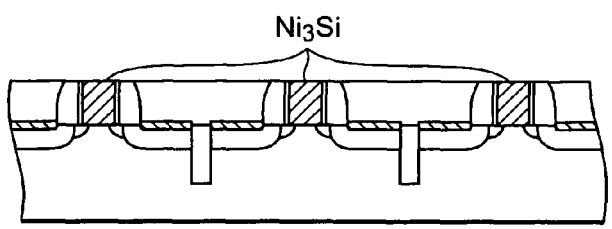

RTA treatment carried out at about 450° C. for about 60 seconds and totally converts polycrystalline silicon film 302 as the gate electrode into a silicide of a Ni-excessive composition (for example, $Ni_3Si$ in this case). Then, the unreacted metal is selectively removed by etching (FIG. 3B).

Figure 3C:
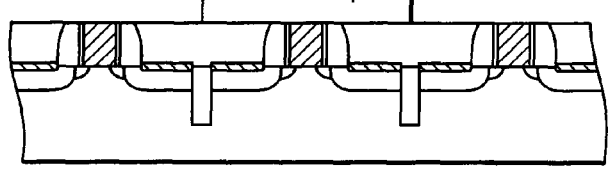

Next, silicon film 303 is selectively deposited by lithography and etching on the upper MISFET surfaces, where reduction of work function is desired (formation of $Ni_2Si$) (FIG. 3C). The thickness of the silicon film is about 25 nm, for example.

Figure 3D:
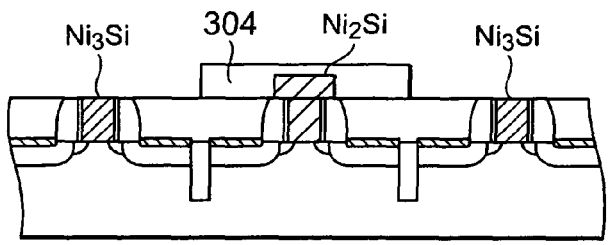

$Ni_3Si$ below selectively disposed silicon film 303 is converted into $Ni_2Si$ by heat treatment carried out at about 240° C. (FIG. 3D). Heat treatment time is set to convert $Ni_3Si$ present in the silicide gate electrode into $Ni_2Si$ at least in the vicinity of the gate-insulating film. For example, it is preferably 1300 seconds or more in this case. Unreacted silicon film 304 is preferably removed selectively.

Figure 3E:
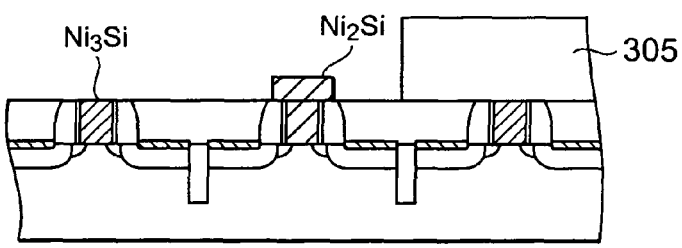

Silicon film 305 is selectively deposited on the upper MISFET region, where reduction of work function is desired (formation of NiSi) (FIG. 3E). The thickness of silicon film 305 is preferably about 100 nm, for example.

Figure 3F:
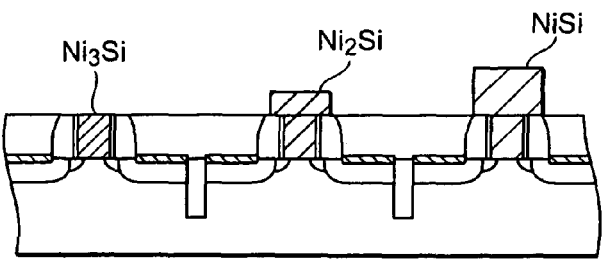

$Ni_3Si$ below selectively disposed silicon film 305 (FIG. 3 E) is converted into NiSi by heat treatment carried out at about 450° C. (FIG. 3F). Heat treatment time is set to convert $Ni_3Si$ present in the silicide gate electrode into NiSi at least in the vicinity of the gate-insulating film. The unreacted silicon film is preferably removed selectively.

The steps of Embodiment 3 can form three types of silicide gate electrodes of NiSi, $Ni_2Si$ and $Ni_3Si$ on the same substrate, where $Ni_3Si$ may be replaced by $Ni_{31}Si_{12}$.

Embodiment 3 can set three threshold voltages on one channel region having a certain impurity concentration. The present invention brings an advantage that no compositional change occurs in the gate electrodes resulting from different lengths, because the composition is changed after a Ni-rich silicide or germanide is formed. This suppresses variation or deterioration of electric characteristics, e.g., threshold voltage.

Embodiment 4

In Embodiments described above, the gate electrode has the upper face ascended, when polycrystalline silicon is converted into $Ni_2Si$ or NiSi. This produces steps on the gate electrode after a second interlayer insulation film is formed thereon, the step height corresponding to the interlayer thickness. Embodiment 4 describes the present invention which produces no steps.

"Proposal of new HfSiON CMOS fabrication process (HAMDAMA) for low standby power device," 2041EDM technology Digest, pp. 95 to 98 describes a gate having a two-layered structure of silicon and NiSi and a process for integrating MISFETs, all of which are composed of NiSi. It describes a process for disposing a gate of two-layered structure with silicon and NiSi, and an MISFET totally composed of NiSi on a single semiconductor substrate. The process uses two different gate types on the same plane, one being completely silicided and the other partly silicided only in the upper surface region by disposing sacrificial gate electrodes of different thickness on the plane. In Embodiment 4, the process described in the above document for forming sacrificial gate electrodes of different thickness on the same wafer plane is applied.

Figure 4A:
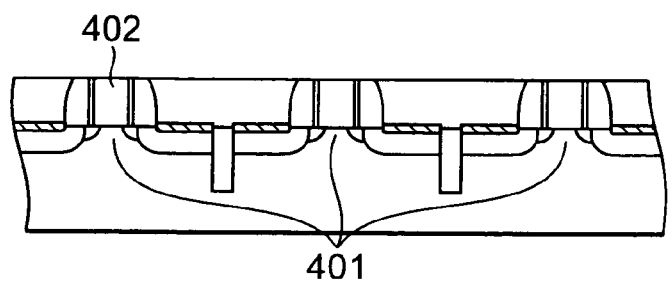
FIGS. 4A-4E show cross-sectional views illustrating production steps of Embodiment 4.

A polycrystalline silicon film is deposited on the same substrate impurity concentration region 401 via a gate-insulating film. It is then selectively etched to form a plurality of polycrystalline films 402 each having a gate electrode shape in such a way to form a structure with their upper sides alone being exposed from an interlayer insulation film of silicon oxide (FIG. 4A).

Figure 4B:
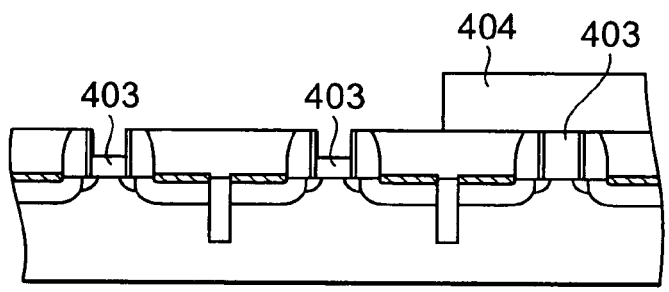

At least one of the polycrystalline silicon films is selectively treated to reduce its thickness to form the polycrystalline silicon films of different thicknesses. For example, sacrificial gate electrodes 403 of different thicknesses are formed by being coated with mask 404 selectively by lithography and then treated anisotropic etching highly selective to the silicon oxide and silicon nitride films (FIG. 4B).

Figure 4C:
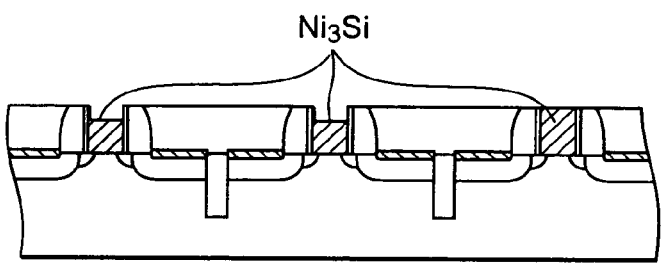

The above structure is totally coated with a Ni film and treated by RTA carried out at 450° C. to convert all of sacrificial gate electrodes 403 completely into $Ni_3Si$ to have a Ni-excessive silicide ($Ni_3Si$) composition. The unreacted Ni and TiN are selectively removed (FIG. 4C). The thickness of the Ni film is set at a level necessary for siliciding at least the thickest sacrificial gate electrode into $Ni_3Si$. The Ni film is preferably coated with a TiN film.

Figure 4D:
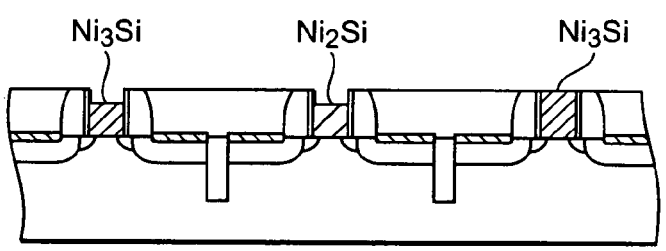
Figure 4E:
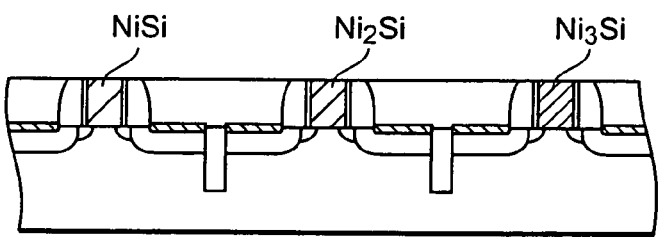
Figure 5:
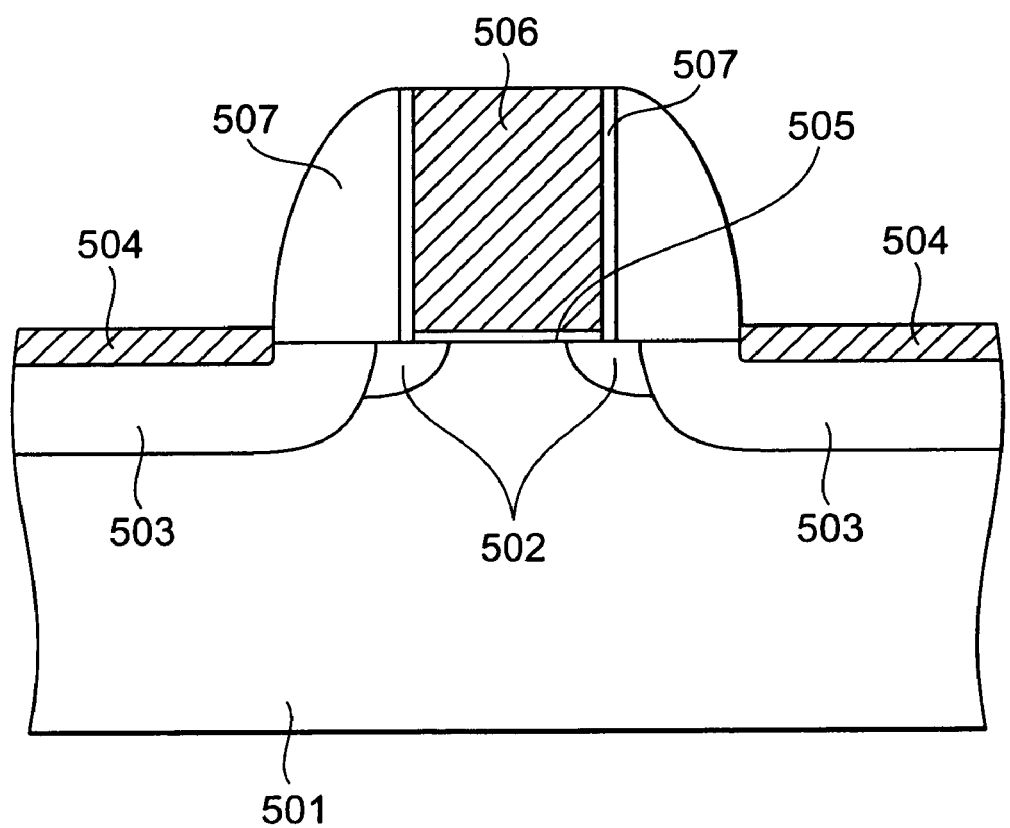
FIG. 5 is a cross-sectional view illustrating Conventional Example 1.
Figure 6A:
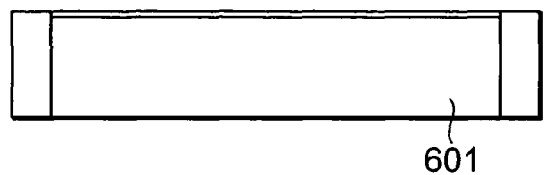
FIGS. 6A-6F show cross-sectional views illustrating production steps of Conventional Example 1.
Figure 6B:
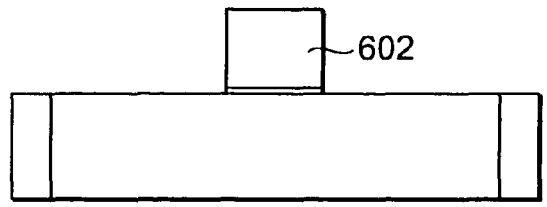
Figure 6C:
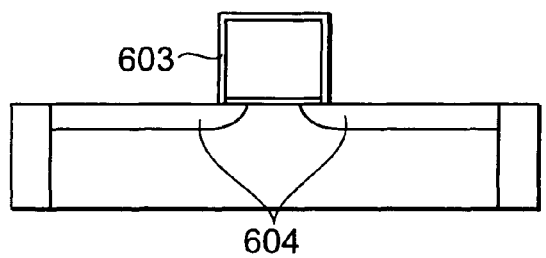
Figure 6D:
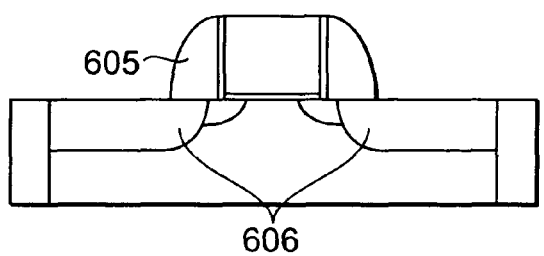
Figure 6E:
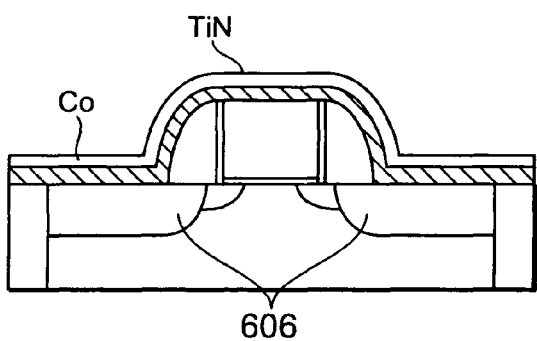
Figure 6F:
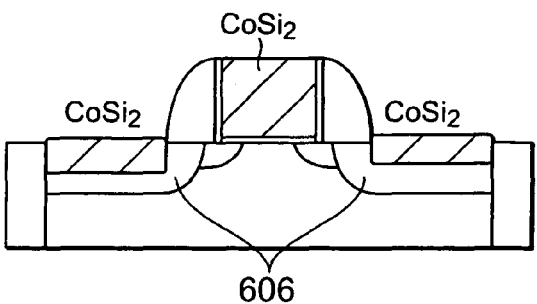
Figure 7A:
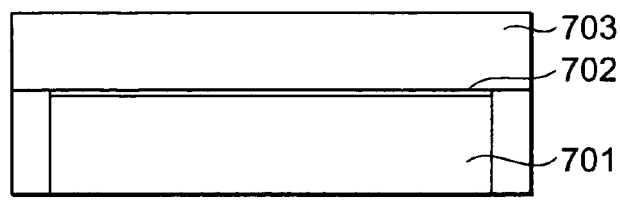
FIGS. 7A-7F show cross-sectional views illustrating production steps of Conventional Example 2.
Figure 7B:
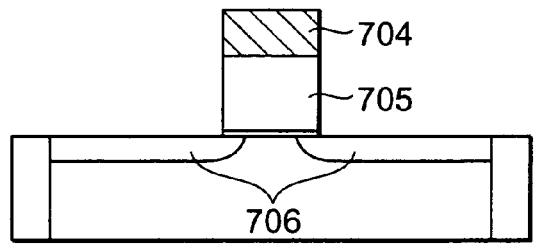
Figure 7C:
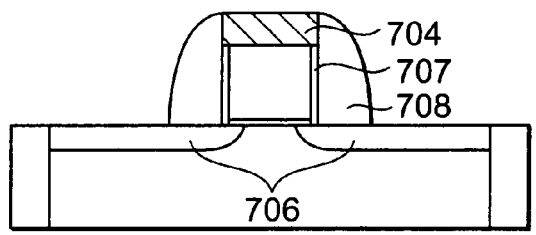
Figure 7D:
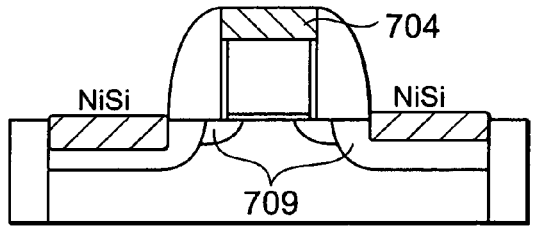
Figure 7E:
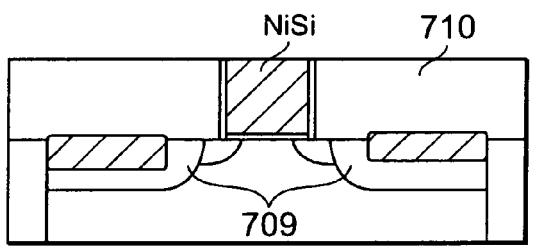
Figure 7F:
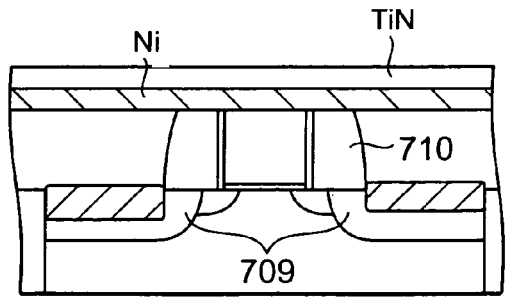
Figure 8A:
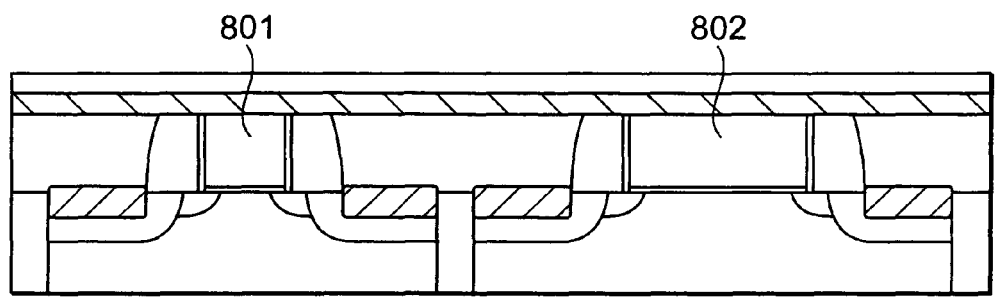
FIGS. 8A-8B show problems to be solved by Conventional Example 3.
Figure 8B:
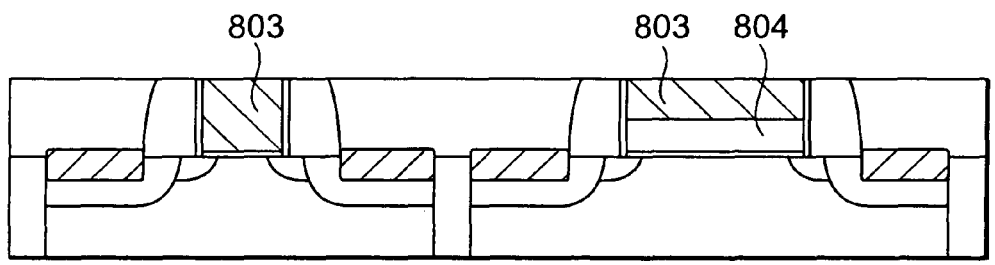
Figure 9A:
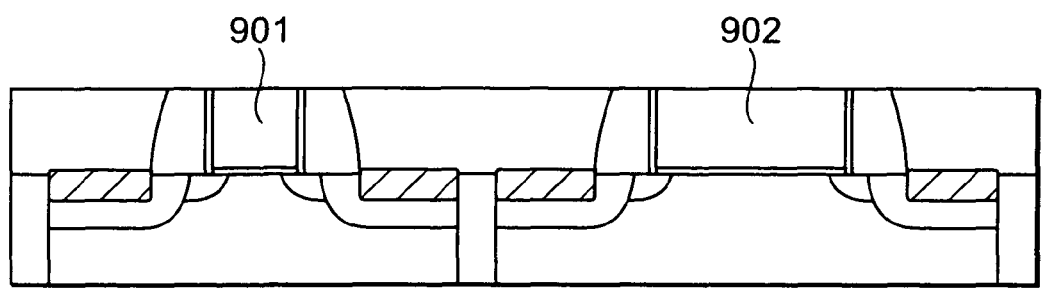
FIGS. 9A-9C show cross-sectional views illustrating production steps of Conventional Example 3.
Figure 9B:
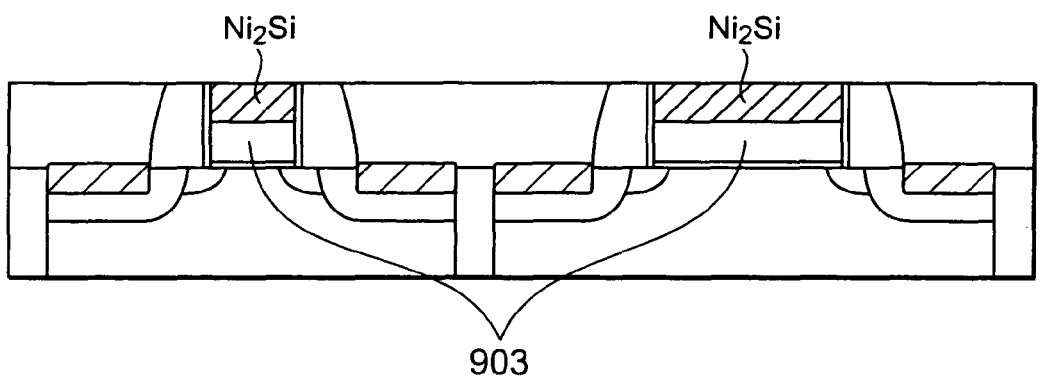
Figure 9C:
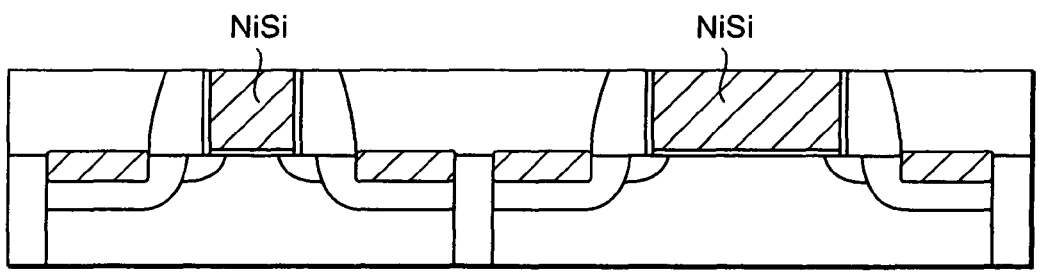

It is possible to selectively dispose gate electrodes of $Ni_2Si$ and NiSi by heat treatment after depositing a silicon film on the gate electrodes where reduction of work function is desired in a manner similar to that for Embodiment 2 (FIGS. 4D and E).

The process of Embodiment 4 can suppress increase in the gate electrode height resulting from formation of the MISFETs of different metal silicide compositions. In other words, the gate electrodes have little steps on the upper side when they are converted into $Ni_3Si$. This can improve focus depth margin of lithography for contact formation, and suppress contact resistance increase and transistor characteristic deterioration.

Embodiments of the present invention are described by referring to the attached drawings. It should be understood, however, that they are included merely to aid in the understanding of the present invention, and variations may be made.

Embodiments describe the present invention with specific nickel silicides taken as examples. However, silicides useful for the present invention are not limited to the above. For example, those silicides composed of the same elements as the above but having a different composition can be used. Other examples of each of MAx, MAy and MAz may be selected from the group consisting of NiSi, $Ni_2Si$, $Ni_3Si$, $Ni_{31}Si_{12}$, $W_5Si_3$, $W_3Si$, $WSi_2$, $Mo_3Si$, $Mo_5Si_3$, $Mo_3Si_2$, $MoSi_2$, $Pt_3Si$, $Pt_2Si$, PtSi, $Ta_{4.5}Si$, $Ta_2Si$, $Ta_5Si_3$, $TaSi_2$, $Pd_3Si$, $Pd_2Si$, PdSi, $Co_3Si$, $Co_2Si$, CoSi, $CoSi_2$, $TiSi_3$, $Ti_5Si_3$, TiSi and $TiSi_2$. MAx, MAy and MAz are composed of the same elements in a different ratio. In other words, they share common M and A which are present in a different ratio.

Silicon used for the gate electrode in Embodiments may be replaced by germanium or silicon/germanium. For example, a gate electrode and source-drain region can be made of a metal germanide by forming a germanium film on a germanium substrate via a gate-insulating film.

Further, it is noted that, Applicant's intent is to encompass equivalents of all claim elements, even if amended later during prosecution.

What is claimed is:

1. A semiconductor device with integrated MIS field-effect transistors, said semiconductor device comprising:
a first gate electrode having a composition represented by MAx;
a second gate electrode having a composition represented by MAy; and
a third gate electrode having a composition represented by MAz,
wherein M comprises at least one metal element selected from the group consisting of W, Mo, Ni, Pt, Ta, Pd, Co, and Ti,
wherein A comprises at least one of silicon and germanium, and
wherein $0<x\leq 3$, $0<y\leq 3$, and $0<z\leq 3$, and x, y and z are different from one another.

2. The semiconductor device according to claim 1, wherein one of the MAx, the MAy, and the MAz is formed by a reaction of said one metal element with at least said one of silicon and germanium at 500° C. or lower.

3. The semiconductor device according to claim 1, wherein A comprises silicon.

4. The semiconductor device according to claim 3, wherein MAx, MAy and MAz are each independently selected from the group consisting of $NiSi$, $Ni_2Si$, $Ni_3Si$, $[Ni_{31}Si_{12}]$, $W_5Si_3$, $W_3Si$, $WSi_2$, $Mo_3Si$, $Mo_5Si_3$, $Mo_3Si_2$, $MoSi_2$, $Pt_3Si$, $Pt_2Si$, $PtSi$, $Ta_{45}Si$, $Ta_2Si$, $Ta_5Si_3$, $TaSi_2$, $Pd_3Si$, $Pd_2Si$, $PdSi$, $Co_3Si$, $Co_2Si$, $CoSi$, $CoSi_2$, $TiSi_3$, $Ti_5Si_3$, $TiSi$, and $TiSi_2$, and MAx, MAy, and MAz comprise same elements in a different ratio, and M and A are presented in a different ratio.

* * * * *